United States Patent
Sarubbi

(10) Patent No.: US 11,927,939 B2
(45) Date of Patent: Mar. 12, 2024

(54) AUXILIARY DEVICES FOR VEHICLE (EV) CHARGERS AND METHODS OF MAKING AND USING THE SAME

(71) Applicant: IoTecha Corp., Cranbury, NJ (US)

(72) Inventor: Kimberly Sarubbi, Brentwood, TN (US)

(73) Assignee: IoTecha Corp., Cranbury, NJ (US)

( * ) Notice: Subject to any disclaimer, the term of this patent is extended or adjusted under 35 U.S.C. 154(b) by 0 days.

(21) Appl. No.: 18/307,967

(22) Filed: Apr. 27, 2023

(65) Prior Publication Data

US 2023/0350382 A1 Nov. 2, 2023

Related U.S. Application Data

(63) Continuation of application No. PCT/US2023/020112, filed on Apr. 27, 2023.
(Continued)

(51) Int. Cl.
*G05B 19/4099* (2006.01)
*G06F 3/00* (2006.01)
(Continued)

(52) U.S. Cl.
CPC ........... *G05B 19/4099* (2013.01); *G06F 3/00* (2013.01); *G06F 30/00* (2020.01); *G06F 30/17* (2020.01)

(58) Field of Classification Search
CPC ..... G05B 19/4009; G06F 30/00; G06F 30/17; G06F 3/00
(Continued)

(56) References Cited

U.S. PATENT DOCUMENTS 8,830,039 B1 * 9/2014 Egan ................. B60L 53/65
320/109
9,898,776 B2 * 2/2018 Apsley ............... G06Q 30/0635
(Continued)

FOREIGN PATENT DOCUMENTS

CN 207481690 U 6/2018
CN 114013324 B 4/2022
(Continued)

OTHER PUBLICATIONS

Glen_2014 (Building an Enclosure using SketchUp and 3D Printing Jun. 1, 2014 (Year: 2014).*
(Continued)

*Primary Examiner* — Brian S Cook
(74) *Attorney, Agent, or Firm* — NK Patent Law

(57) ABSTRACT

Disclosed herein are methods, systems, and devices for providing customized electric vehicle (EV) chargers. In one embodiment, a device is disclosed that includes a processor, a memory electrically coupled with the processor, a display electrically coupled with the processor, and an enclosure. The enclosure includes a mounting arrangement for securing the device to an EV charger. The device also includes a first communication interface electrically coupled with the processor. The first communication interface is configured for direct connection to the EV charger. The device further includes a second communication interface electrically coupled with the processor. The second communication interface is configured for connection to an internet protocol (IP) network.

27 Claims, 11 Drawing Sheets

Related U.S. Application Data

(60) Provisional application No. 63/335,550, filed on Apr. 27, 2022.

(51) Int. Cl.
  *G06F 30/00* (2020.01)
  *G06F 30/17* (2020.01)

(58) Field of Classification Search
  USPC .............................................................. 703/1
  See application file for complete search history.

(56) References Cited

U.S. PATENT DOCUMENTS

| | | | |
|---|---|---|---|
| D838,668 S * | 1/2019 | Westfall | D13/107 |
| 11,487,850 B1 * | 11/2022 | Nieto | G06Q 10/083 |
| 2004/0183796 A1 | 9/2004 | Velde | |
| 2014/0160280 A1 * | 6/2014 | Rodr guez | H04N 7/188 |
| | | | 348/143 |
| 2015/0145479 A1 | 5/2015 | Deboer, III | |
| 2016/0221464 A1 | 8/2016 | Mu | |
| 2016/0297315 A1 | 10/2016 | Gonzalez | |
| 2019/0217529 A1 | 7/2019 | Ammi | |
| 2020/0259336 A1 | 8/2020 | Rao | |
| 2020/0369169 A1 | 11/2020 | Mercer | |
| 2021/0170894 A1 | 6/2021 | Deh | |
| 2022/0089237 A1 * | 3/2022 | Sverdlov | B25J 9/1697 |
| 2023/0169543 A1 * | 6/2023 | Korte | G16H 50/30 |
| | | | 705/14.66 |

FOREIGN PATENT DOCUMENTS

| | | | | |
|---|---|---|---|---|
| WO | WO-2016089925 A1 * | 6/2016 | | B60L 11/1846 |
| WO | WO-2021185998 A1 * | 9/2021 | | A61B 5/167 |

OTHER PUBLICATIONS

Goulding_2018 (3D Printing & EV Charging Stations, Jun. 10, 2018) (Year: 2018).*

ISA/US; International Search Report and Written Opinion for corresponding International Patent Application No. PCT/US2023/020112, dated Oct. 12, 2023, 10 pages.

Goulding, Charles; "30 Printing & EV Charging Stations"; 3DPrint.CQm; 3D Design, 3D Printing, Business; published Jun. 10, 2018, retrieved Nov. 1, 2023 from: URL https://3dprint.com/216120/3d-printing-ev-charging-stations/.

Tw HomeShow; "TESLA | 3D Printed mobile SUPERCHARGER | 3D Print Your TESLA Supercharger", uploaded Jan. 2, 2023, retrieved Nov. 1, 2023 from: URL https://www.youtube.com/watch?v=D4UerDjl3kk.

Winmate; "Smart Charging Station Solution", retrieved Nov. 1, 2023 from: URL https://www.winmate.com/Solutions/SmartCharging.

* cited by examiner

AUXILIARY DEVICES FOR VEHICLE (EV) CHARGERS AND METHODS OF MAKING AND USING THE SAME

PRIORITY CLAIM

This application is a continuation application of PCT Patent Application No. PCT/US2023/020112 titled "AUXILIARY DEVICES FOR VEHICLE (EV) CHARGERS AND METHODS OF MAKING AND USING THE SAME," filed Apr. 27, 2023, which claims the benefit of U.S. Provisional Patent Application Ser. No. 63/335,550, titled "AUXILIARY DEVICES FOR VEHICLE (EV) CHARGERS AND METHODS OF MAKING AND USING THE SAME," filed Apr. 27, 2022, the entire contents of which is hereby incorporated herein by reference.

TECHNICAL FIELD

The present invention relates generally to the field of electric vehicle (EV) charging. More specifically, the present invention relates generally to the customization of EV chargers by an end user.

BACKGROUND

With the growth of electric vehicles (EVs), the EV charging equipment market is expected to have a compound annual growth rate (CAGR) exceeding 27 percent through 2025. In addition to the public chargers, users are installing home based EV chargers for convenience.

Accordingly, there remains a need for methods, devices, and systems for providing unique EV chargers for users.

SUMMARY

Disclosed herein are methods, systems, and devices for providing customized electric vehicle (EV) chargers. In one embodiment, a device is disclosed that includes a processor, a memory electrically coupled with the processor, a display electrically coupled with the processor, and an enclosure. The enclosure includes a mounting arrangement for securing the device to an EV charger. The device also includes a first communication interface electrically coupled with the processor. The first communication interface is configured for direct connection to the EV charger. The device further includes a second communication interface electrically coupled with the processor. The second communication interface is configured for connection to an internet protocol (IP) network.

In some embodiments, the enclosure may be custom designed by a user of the EV charger. In further embodiments, a first portion of the enclosure may be generated on a three dimensional (3-D) printer using a 3-D print file. The 3-D print file may be a STL 3-D print file, an OBJ 3-D print file, an AMF 3-D print file, a 3MF 3-D print file or the like. In further embodiments, the 3-D print file may be generated based on a first plurality of attributes selected by the user and a second plurality of attributes associated with the EV charger.

In some embodiments, the first plurality of attributes may include a sports team attribute, an automobile brand attribute, and/or the like. The first plurality of attributes may also include an EV charger model number attribute, an EV serial number attribute, and/or the like. The second plurality of attributes may include physical dimensions and/or mounting locations associated with the EV charger.

In some embodiments, the first plurality of attributes may be selected by the user using a graphical user interface (GUI) on a client device associated with the user. The client device may be a smart phone, a smart TV, a smart tablet, a laptop, a personal computer, a work station, a smart watch, or the like.

In some embodiments, the GUI may be provided by an application specific program. In certain embodiments, the application specific program may be an iOS® app, an Android® OS app, or the like.

In some embodiments, the GUI may be provided by a web browser. The web browser may be a Microsoft Internet Explorer® browser, a Microsoft Edge® browser, an Apple Safari® browser, a Google Chrome® browser, a Mozilla Firefox® browser, an Opera® browser, or the like In some embodiments, the user may have purchased the EV charger.

In some embodiments, the device may further include a third communication interface electrically coupled with the processor. The third communication interface may be configured for connection to a sub-metering appliance. In further embodiments, the sub-metering appliance may be configured to be wired between the EV charger and a power grid. The processor may be configured for receiving sub-metering data from the sub-metering appliance via the third communication interface. In certain embodiments, the third communication interface may be an RS-485 compliant interface. In other embodiments, the EV charger may include sub-metering circuitry; and the processor may be configured for receiving sub-metering data from the sub-metering circuitry.

In some embodiments, the processor may be configured for receiving media data from the second communication interface and presenting the media data via the display.

In some embodiments, the first communication interface may be a universal serial bus (USB) interface, an Ethernet interface, a wireless interface, or the like.

In some embodiments, the second communication interface may be a wide area network (WAN) interface, a local area network (LAN) interface, or the like. In further embodiments, the second communication interface may be at least one of a Wi-Fi interface, a cellular interface, or the like.

In another embodiment, a method of manufacture for a device is disclosed. The device is configured to be installed on an EV charger The method includes (1) receiving a first plurality of attributes associated with the device, (2) receiving a second plurality of attributes associated with the EV charger, (3) generating a first 3-D print file based on the first plurality of attributes and the second plurality of attributes, and (4) transmitting the first 3-D print file to a 3-D printer.

In some embodiments, the first 3-D print file may be an STL 3-D print file, an OBJ 3-D print file, an AMF 3-D print file, a 3MF 3-D print file, or the like.

In some embodiments, the first plurality of attributes may be selected by a user using a GUI on a client device associated with the user. In further embodiments, the client device may be a smart phone, a smart TV, a smart tablet, a laptop, a personal computer, a work station, a smart watch, or the like.

In some embodiments, the GUI may be provided by an application specific program. In further embodiments, the application specific program may be an iOS® app, an Android® OS app, or the like.

In some embodiments, the GUI may be provided by a web browser. In further embodiments, the web browser may be a Microsoft Edge® browser, a Microsoft Internet Explorer® browser, a Microsoft Edge® browser, an Apple Safari® browser, a Google Chrome® browser, a Mozilla Firefox® browser, an Opera® browser, or the like.

In some embodiments, the method may be implemented on a server. In further embodiments, the server may be a portion of a networked computing environment. In still further embodiments, the networked computing environment may be a cloud computing environment. Additionally, the server may be a virtualized server.

In some embodiments, the method may further include generating an enclosure for the device on a 3-D printer using the first 3-D print file. In further embodiments, the method may further include installing a processor, a memory, a display, a first communication interface, and a second communication interface within the enclosure. In certain embodiments, the first communication interface may be a USB interface, an Ethernet interface, a wireless interface, or the like. The second communication interface may be a WAN interface, a LAN interface, or the like.

In some embodiments, the method may further include comprising installing a third communication interface. The third communication interface may be configured for receiving sub-metering data from a sub-metering appliance. In further embodiments, the third communication interface may be an RS-485 compliant interface.

In some embodiments, the method may further include packaging the device for shipment. In further embodiments, the method may also include shipping the device to an address associated with the user.

In some embodiments, the first plurality of attributes may include a sports team attribute, an automobile brand attribute, and/or the like.

In some embodiments, the first plurality of attributes may include an EV charger model number attribute, an EV charger serial number, and/or the like.

In some embodiments, the method may further include generating a charging cord holder for the EV charger on a 3-D printer using the second 3-D print file. In further embodiments, the method may further include packaging the charging cord holder for shipment. In still further embodiments, the method may further include shipping the charging cord holder to an address associated with a user.

In some embodiments, the method may further include minting a non-fungible token (NFT) of a likeness of the device and providing the NFT to a crypto wallet associated with a user of the EV charger.

The features and advantages described in this summary and the following detailed description are not all-inclusive. Many additional features and advantages will be apparent to one of ordinary skill in the art in view of the drawings, specification, and claims presented herein.

BRIEF DESCRIPTION OF THE DRAWINGS

The foregoing summary, as well as the following detailed description of preferred embodiments, is better understood when read in conjunction with the appended drawings. For the purposes of illustration, there is shown in the drawings' exemplary embodiments; however, the presently disclosed invention is not limited to the specific methods and instrumentalities disclosed. In the drawings.

DETAILED DESCRIPTION

Figure 1:
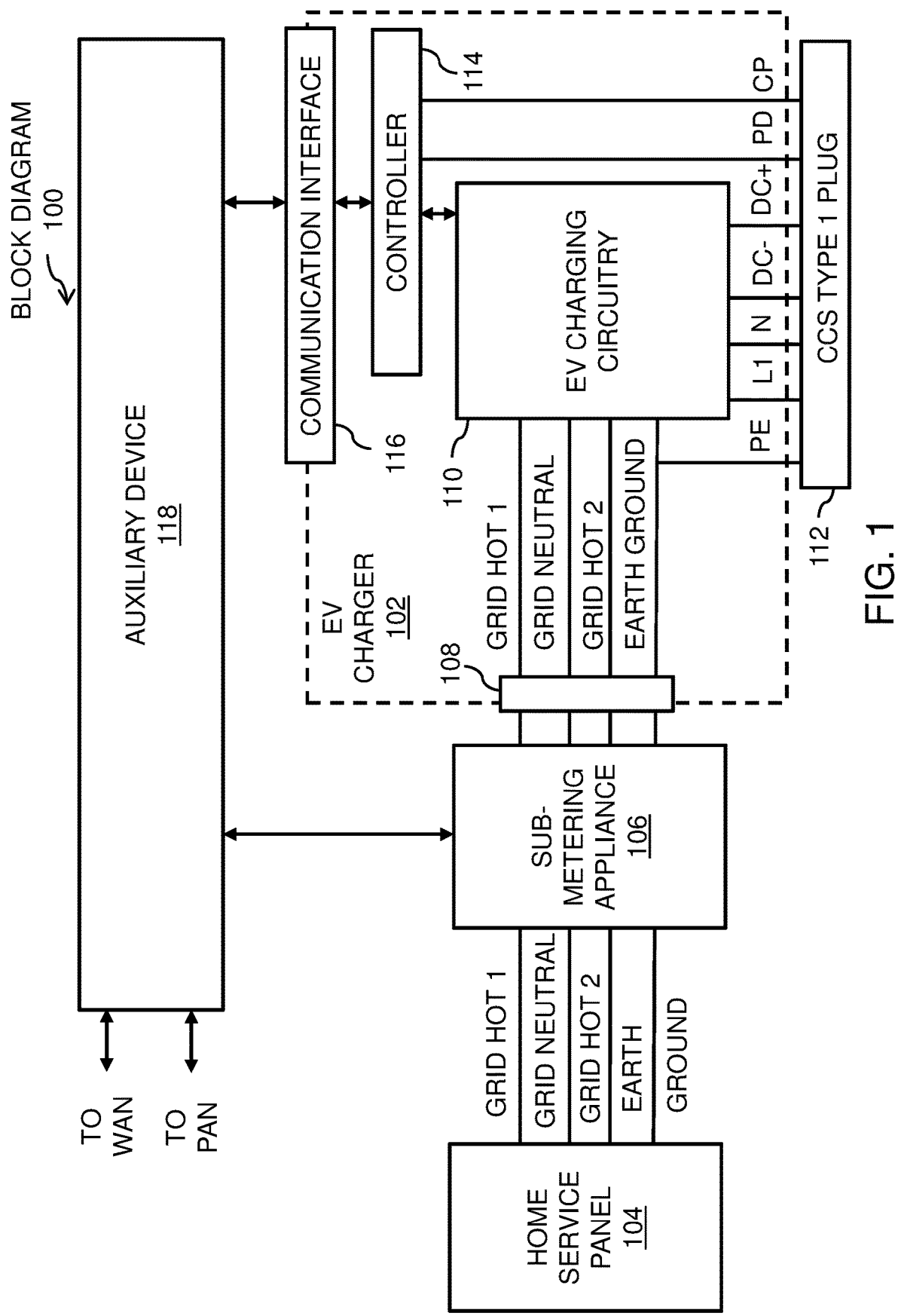
FIG. 1 depicts a block diagram illustrating an auxiliary device and an electric vehicle (EV) charger electrically coupled with a home service panel via a sub-metering appliance in accordance with embodiments of the present disclosure.

The following description and drawings are illustrative and are not to be construed as limiting. Numerous specific details are described to provide a thorough understanding of the disclosure. However, in certain instances, well-known or conventional details are not described in order to avoid obscuring the description. References to "one embodiment" or "an embodiment" in the present disclosure can be, but not necessarily are, references to the same embodiment and such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

Disclosed herein are auxiliary devices for electric vehicle (EV) chargers, and methods of making and using the same. The auxiliary devices may be custom designed in shape and features by an owner of an EV charger. The auxiliary device may make the EV charger more aesthetically pleasing and provide additional features not currently present on the EV charger. The additional features may include branding of the enclosure and other capabilities (e.g., targeted advertising via a display) that may offset the purchase cost and/or on going usage of the EV charger.

FIG. 1 depicts a block diagram 100 illustrating an EV charger 102 electrically coupled with a home service panel 104 via a sub-metering appliance 106 in accordance with embodiments of the present disclosure. The home service panel 104 is configured to be coupled with a home energy meter (not shown in FIG. 1). The home based panel 104 is also configured to provide power to other home based loads via home electrical wiring as is commonly known in the art. The home electrical wiring is compliant to at least one version the National Electrical Code.

Electrical conductors grid hot 1, grid neutral, grid hot 2, and earth ground from the home service panel 104 are coupled through the sub-metering appliance 106 and are also compliant to at least one version the National Electrical Code. The EV charger 102 includes an electrical interconnect 108 to further couple grid hot 1, grid neutral, grid hot 2, and earth ground to EV charging circuitry 110 (e.g., split-phase power) within the EV charger 102.

The EV charger 102 also includes a CCS Type 1 plug 112, a controller 114, and a communication interface 116. The controller 114 is configured to monitor a control pilot (CP) contact to maintain a charging rate within a safe operating limit of an EV. The EV charging circuitry 110 is configured to provide AC power to the CCS Type 1 plug 112. The EV charging circuitry 110 includes switch circuitry for enabling and/or disabling AC power to the CCS Type 1 plug 112 via a first AC (L1) contact and a second AC (N) contact. The L1 contact and the N contact provide AC power to internal charging circuitry within the EV. The EV charging circuitry 110 also includes an AC-to-DC rectifier for providing DC power to the EV charging interface via a DC+ contact and a DC− contact. The DC+ contact and the DC− contact provide DC charging current to a battery pack of the EV in this scenario. A protective earth (PE) contact of the CCS Type 1 plug 112 is electrically coupled with earth ground provided by the home breaker box panel 104.

The EV charger 102 is communicatively coupled with an auxiliary device 118 via the communication interface 116. The communication interface 116 may be a universal serial bus (USB) interface, an Ethernet interface, a wireless interface (e.g., Wi-Fi or Bluetooth®), or the like. The auxiliary device 118 is also communicatively coupled with the sub-metering appliance 106. The auxiliary device 118 includes wide area network (WAN) connectivity and personal area network (PAN) connectivity.

The auxiliary device 118 is mechanically attached to the EV charger 102 by a mounting arrangement. The mounting arrangement may include a plurality of bolts and/or nuts, one or more magnets, one or more adhesives, and/or the like. The auxiliary device 118 is configured to monitor and control the EV charger 102 and the sub-metering appliance 106

The auxiliary device 118 may be custom designed by an owner and/or user of the EV charger 102. The EV charger 102 may be basically cuboid shaped allowing the auxiliary device 118 to be installed over the EV charger 102 in a manner as to hide the EV charger 102 from view. The auxiliary device 118 may include a charging cord holder or a separate charging cord holder may also be custom designed by the owner and/or the user of the EV charger 102. The EV charger 102 and the sub-metering appliance 106 may require installation by a licensed electrician, while the auxiliary device 118 may be installed by the owner and/or the user of the EV charger 102. The EV charger 102 may be a fully functional EV charging device without having the auxiliary device 118 installed. The EV charger 102 may be installed during construction of a new home. For example, every home in a new development may have the same model EV charger installed at time of build before being purchased by a home owner. In some embodiments, the sub-metering appliance 106 may be omitted from the installation. The auxiliary device 118 may be branded towards a sports team, an automotive make and/or model, or the like.

Figure 2:
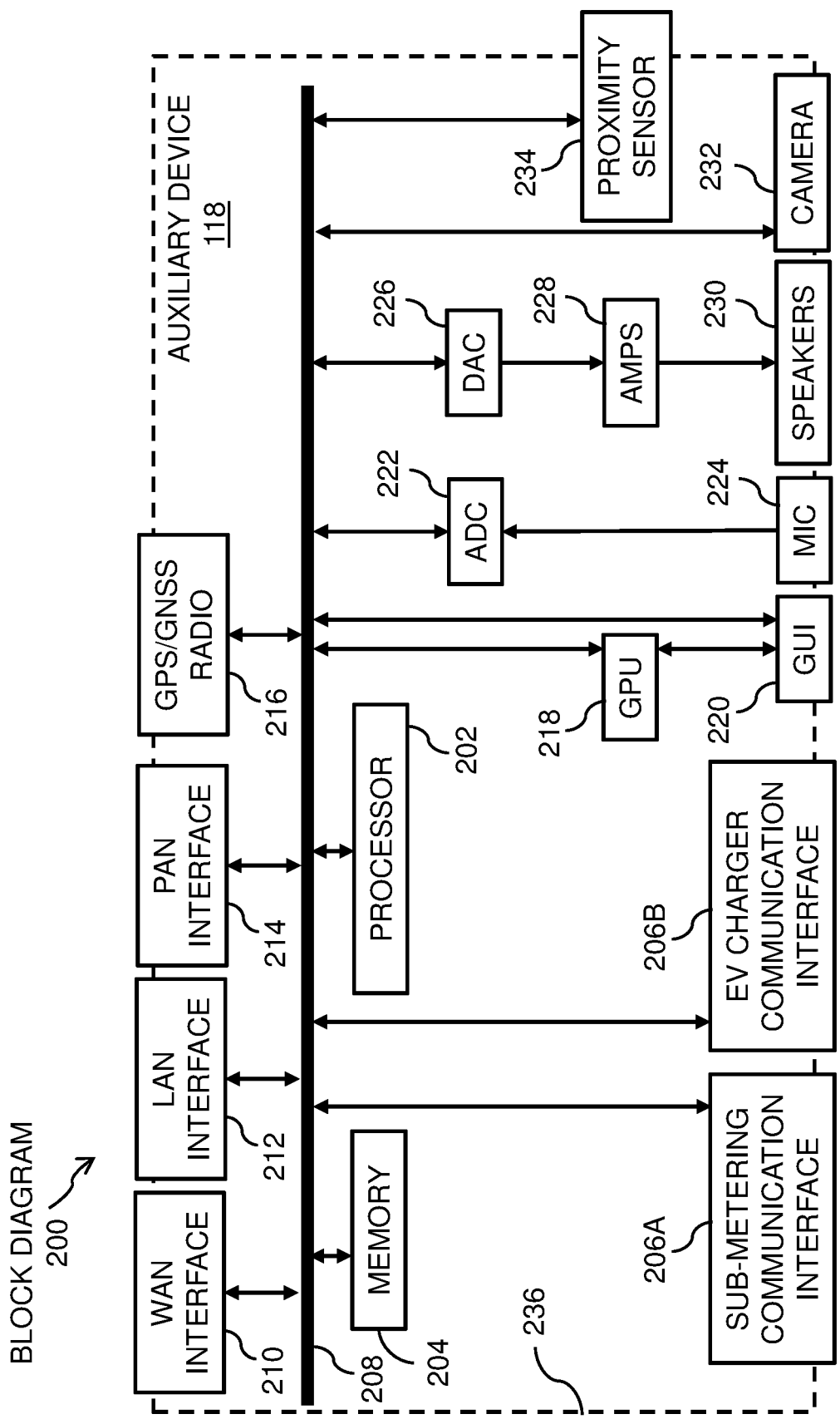
FIG. 2 depicts a block diagram further illustrating the auxiliary device of FIG. 1 in accordance with embodiments of the present disclosure.

FIG. 2 depicts a block diagram 200 further illustrating the auxiliary device 118 of FIG. 1 in accordance with embodiments of the present disclosure. The auxiliary device 118 includes a processor 202, and a memory 204. The auxiliary device 118 also includes a bus 208 electrically coupling the processor 202 with the memory 212. The bus 208 also electrically couples a WAN interface 210, a local area network (LAN) interface 212, a PAN interface 214, and a global positioning system and/or global navigation satellite system (GNSS) radio 216 with the processor 202.

The WAN interface 210 may configured to communicate with a remote server over a network (not shown in FIG. 1 or FIG. 2). The remote server may provide additional features (e.g., targeted advertising) and functions (e.g., customized EV charging schedules) to the EV charger 102 using the auxiliary device 118. In some embodiments, the LAN interface 212 may be configured to indirectly communicate with the remote server over the network via a home based router and modem.

The GNSS radio 216 facilitates the processor 204 in determining a present location of the EV charger 102. The WAN interface 210 may include 2G, 3G, 4G, 5G, and/or the like technologies. The LAN interface 212 may include Wi-Fi technologies such as 802.11a, 802.11b/g/n, and/or 802.11ac circuitry. The PAN interface 214 may include Bluetooth® technologies. The PAN interface 214 may be configured to pair with a smart phone and/or smart tablet within a proximity of the EV charger 102.

Additionally, the PAN interface 212 may be configured to pair with wireless speakers, wireless headphones, wireless earbuds, and/or the like. The bus 208 also electrically couples a graphical processing unit (GPU) 218 and a graphical user interface (GUI) 220 with the processor 202. The GUI 230 may be provided by a touchpad display.

A microphone (mic) 224 is electrically coupled with the bus 208 via an analog-to-digital convert 228. Speakers 230 are also electrically coupled with the bus 208 via amplifiers (amps) 228 and at least one digital-to-analog converter (DAC) 226. Additionally, a camera 232 and a proximity sensor 234 are electrically coupled with the processor 202 via the bus 208. In some embodiments, the bus 208 may be replaced by multiple buses and/or point-to-point connections.

The auxiliary device 118 also includes an enclosure 236 housing the previously described components. The enclosure 236 may be generated by a three-dimensional (3-D) print file on a 3-D printer (e.g., from Pacific Ocean reclaimed plastic or the like). A homeowner may go online and custom design their own auxiliary device 118 (including custom designing the enclosure 236). Additionally, a non-fungible token NFT associated with the auxiliary device 118 may be minted and provided to a crypto wallet of the homeowner.

In other embodiments, the homeowner may purchase pre-manufactured and pre-branded auxiliary devices 118 (e.g., Telsa®, Mercedes®, IoTecha®, etc.). The auxiliary device 118 may optimize charging for the homeowner and provide targeted advertising to offset EV charging costs and/or purchasing the auxiliary device 118.

Figure 3:
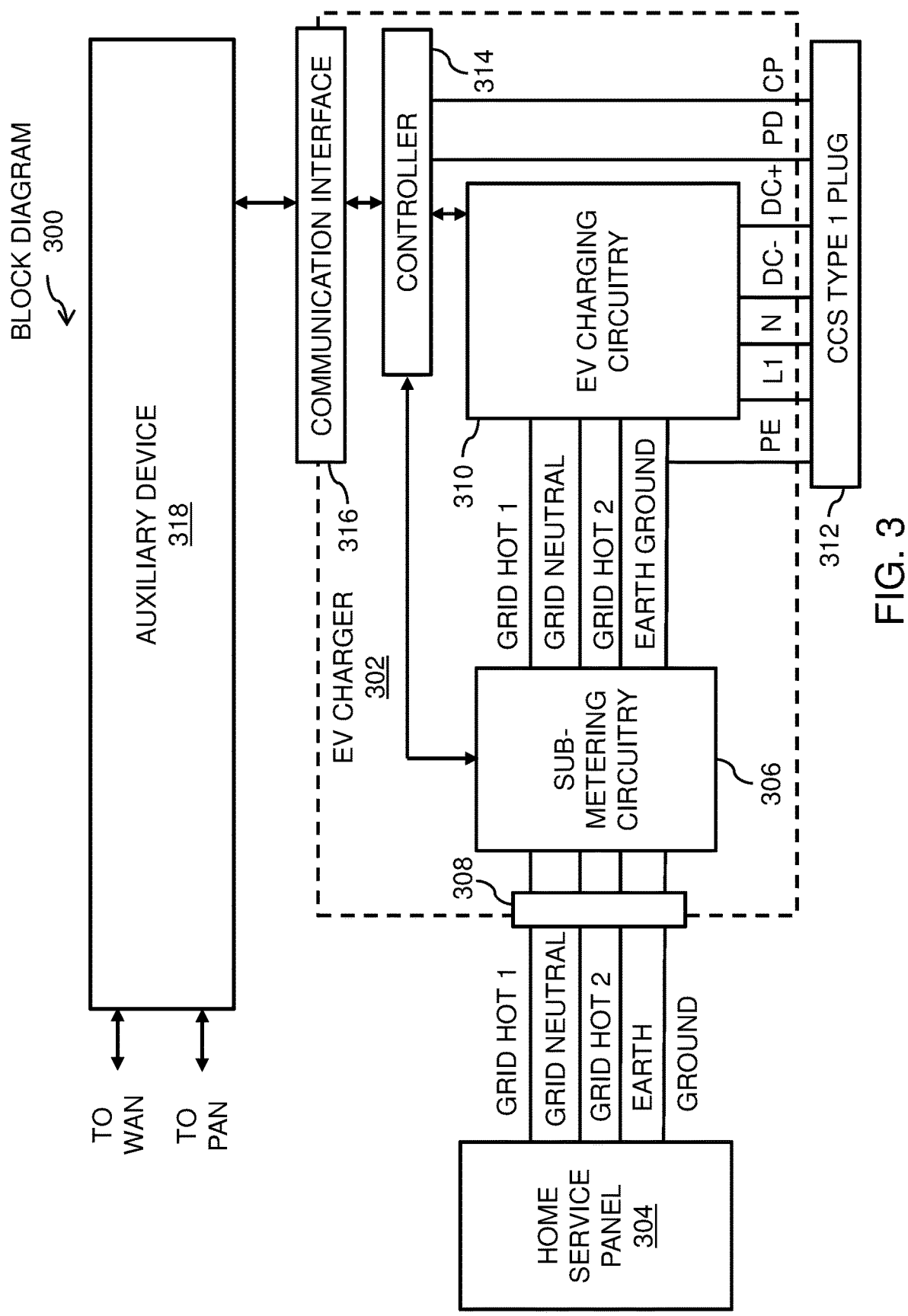
FIG. 3 depicts a block diagram illustrating another auxiliary device and an EV charger electrically coupled with a home service panel in accordance with embodiments of the present disclosure in accordance with embodiments of the present disclosure.

FIG. 3 depicts a block diagram 300 illustrating an EV charger 302 electrically coupled with a home service panel 304 in accordance with embodiments of the present disclosure. In this embodiment, sub-metering circuitry 306 is built into the EV charger 302. The home service panel 304 is configured to be coupled with a home energy meter (not shown in FIG. 3). The home based panel 304 is also configured to provide power to other home based loads via home electrical wiring as is commonly known in the art. The home electrical wiring is compliant to at least one version the National Electrical Code. Electrical conductors grid hot 1, grid neutral, grid hot 2, and earth ground (e.g., split-phase power) from the home service panel 304 are coupled through the sub-metering circuitry 306 to EV charging circuitry 310 within the EV charger 302.

The EV charger 302 also includes a CCS Type 1 plug 312, a controller 314, and a communication interface 316. The controller 314 is configured to monitor a control pilot (CP) contact to maintain a charging rate within a safe operating limit of an EV. The EV charging circuitry 310 is configured to provide AC power to the CCS Type 1 plug 312. The EV charging circuitry 310 includes switch circuitry for enabling and/or disabling AC power to the CCS Type 1 plug 312 via a first AC (L1) contact and a second AC (N) contact. The L1 contact and the N contact provide AC power to internal charging circuitry within the EV. The EV charging circuitry 310 also includes an AC-to-DC rectifier for providing DC power to the EV charging interface via a DC+ contact and a DC− contact. The DC+ contact and the DC− contact provide DC charging current to a battery pack of the EV in this scenario. A protective earth (PE) contact of the CCS Type 1 plug 312 is electrically coupled with earth ground provided by the home breaker box panel 304. The controller 314 is also configured to monitor and control the sub-metering circuitry 306.

The EV charger 102 is communicatively coupled with an auxiliary device 318 via the communication interface 316. The communication interface 116 may be a universal serial bus (USB) interface, an Ethernet interface, a wireless interface (e.g., Wi-Fi or Bluetooth®), or the like.

The auxiliary device 318 is mechanically attached to the EV charger 302 by a mounting arrangement. The mounting arrangement may include a plurality of bolts and/or nuts, one or more magnets, one or more adhesives, and/or the like. The auxiliary device 318 is configured to monitor and control the EV charger 302.

Like the auxiliary device 118 of FIG. 1, the auxiliary device 318 may be custom designed by an owner and/or user of the EV charger 302. The EV charger 302 may be basically cuboid shaped allowing the auxiliary device 318 to be installed over the EV charger 302 in a manner as to hide the EV charger 302 from view. The auxiliary device 318 may include a charging cord holder or a separate charging cord holder may also be custom designed by the owner and/or the user of the EV charger 302. The EV charger 302 may require installation by a licensed electrician, while the auxiliary device 318 may be installed by the owner and/or the user of the EV charger 302. The EV charger 302 may be a fully functional EV charging device without having the auxiliary device 118 installed. The EV charger 102 may be installed during construction of a new home. For example, every home in a new development may have the same model EV charger installed at time of build before being purchased by a home owner. In some embodiments, the sub-metering appliance 106 may be omitted from the installation.

The auxiliary device 318 may be branded towards a sports team, an automotive make and/or model, or the like.

Figure 4:
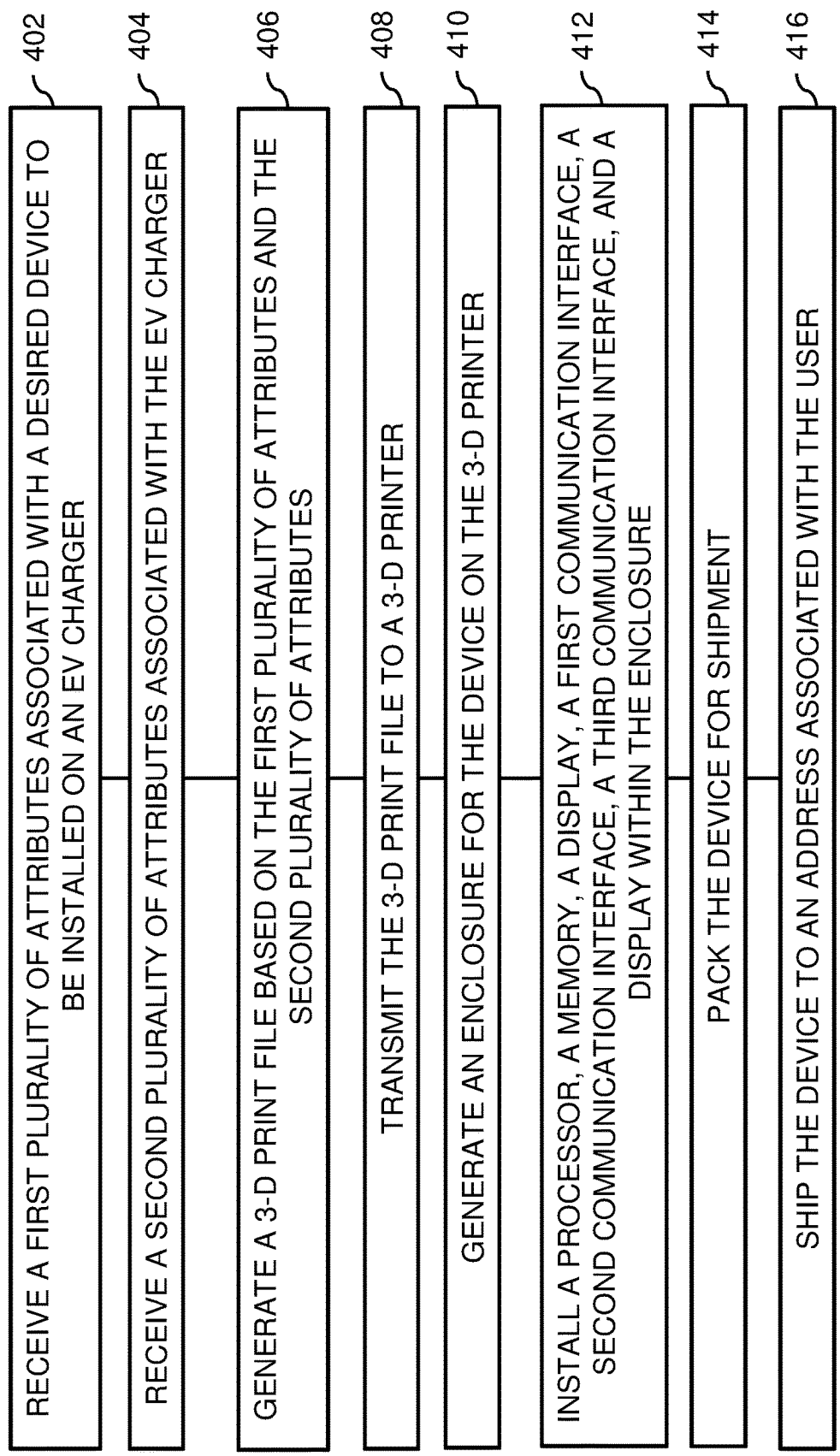
FIG. 4 depicts a flowchart illustrating a method of manufacturing a device such as the auxiliary device of FIG. 1 and FIG. 2, or the auxiliary device of FIG. 3 in accordance with embodiments of the present disclosure.

FIG. 4 depicts a flowchart 400 illustrating a method of manufacturing a device such as the auxiliary device 118 of FIG. 1 and FIG. 2, or the auxiliary device 318 of FIG. 3 in accordance with embodiments of the present disclosure.

In step 402, the method includes receiving a first plurality of attributes associated with a desired device to be installed on an EV charger. The first plurality of attributes may be selected by a user using a graphical user interface (GUI) on a client device associated with the user. The client device may be at least one of a smart phone, a smart TV, a smart tablet, a laptop, a personal computer, a work station, and/or the like. The GUI may be provided by an application specific program. The application specific program may be an iOS® app, an Android® OS app, or the like. In other embodiments, the GUI may be provided by a web browser. The web browser may be a Microsoft Edge® browser, a Microsoft Internet Explorer® browser, a Microsoft Edge® browser, an Apple Safari® browser, a Google Chrome® browser, a Mozilla Firefox® browser, an Opera® browser, or the like. The first plurality of attributes may include a sports team attribute, an automobile brand attribute, or the like. The first plurality of attributes may also include an EV charger model number attribute.

In step 404, the method further includes receiving a second plurality of attributes associated with the EV charger;

In step 406, the method further includes generating a first three-dimensional (3-D) print file based on the first plurality of attributes and the second plurality of attributes; and In step 408, the method further includes transmitting the first 3-D print file to a 3-D printer. The first 3-D print file may be a STL 3-D print file, an OBJ 3-D print file, an AMF 3-D print file, a 3MF 3-D print file, or the like.

Steps 402, 404, 406, and 408 may be implemented on a server. The server may be a portion of a networked computing environment. The networked computing environment may be a cloud computing environment. The server may also be a virtualized server.

In step 410, the method further includes generating an enclosure for the device on a 3-D printer using the first 3-D print file.

In step 412, the method further includes installing a processor, a memory, a display, a first communication interface, a second communication interface, a third communication interface, and a display within the enclosure. The first communication interface may be a universal serial bus (USB) interface, an Ethernet interface, a wireless interface, or the like. The second communication interface may be a wide area network (WAN) interface, a local area network (LAN) interface, or the like. The third communication interface may be an RS-485 compliant interface, or the like. In some embodiments, step 412 may also include installing a mounting arrangement for attaching the device to the EV charger. The mounting arrangement may include a plurality of bolts and/or nuts, one or more magnets, one or more adhesives, and/or the like In step 414, the method further includes packaging the device for shipment.

In step 416, the method further includes shipping the device to an address associated with the user.

In some embodiments (not shown in FIG. 4), the method may further include (1) generating a second 3-D print file based on the first plurality of attributes and the second plurality of attributes, (2) transmitting the second 3-D print file to the 3-D printer or another 3-D printer, (3) generating a charging cord holder using the second 3-D print file, (4) packaging the charging cord holder for shipment, and (5) shipping the charging cord holder to the address associated with the user.

Figure 5:
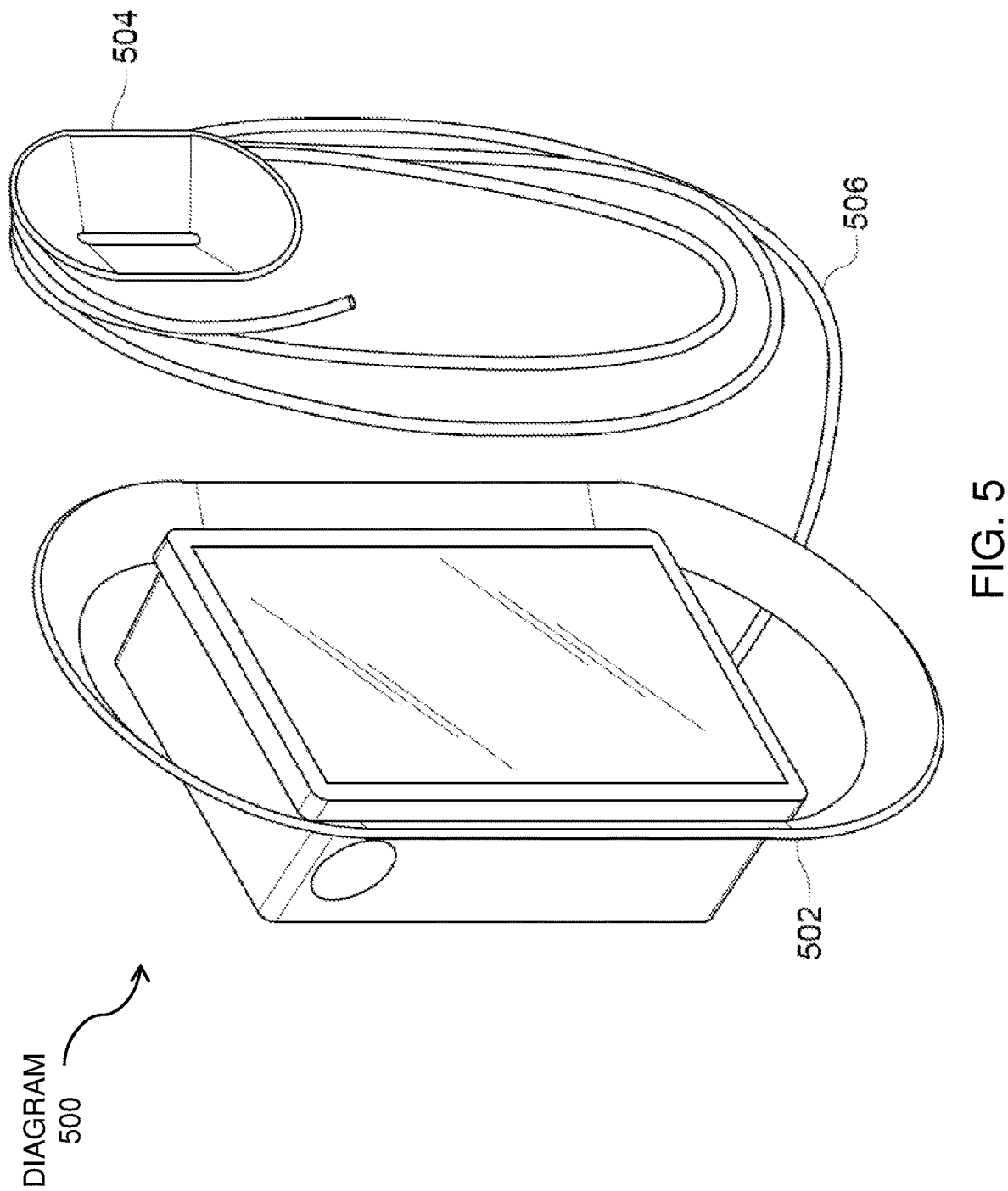
FIG. 5 depicts a diagram illustrating an auxiliary device positioned over and attached to an EV charger in accordance with embodiments of the present disclosure.

FIG. 5 depicts a diagram 500 illustrating an auxiliary device 502 positioned over and attached to an EV charger in accordance with embodiments of the present disclosure. Diagram 500 also illustrates a charging cord holder 504 supporting a charging cord 506 that includes a CCS Type 1 plug (not shown in FIG. 5). The auxiliary device 502 and charging cord holder 504 may have been generated as described in the method of FIG. 4. The auxiliary device 502 may be similar to auxiliary device 118 of FIG. 1 or auxiliary device 318 of FIG. 3.

Figure 6:
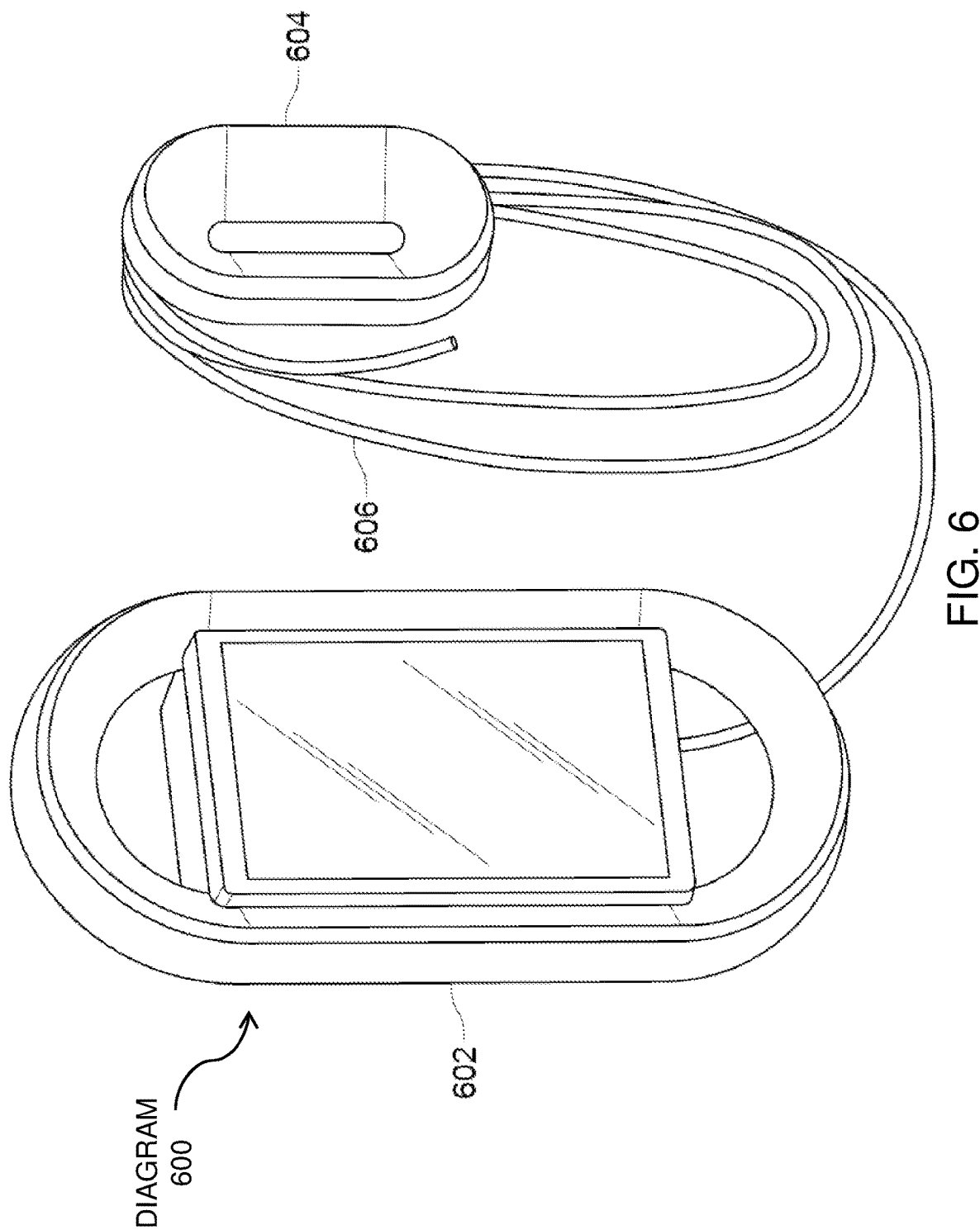
FIG. 6 depicts a diagram illustrating an auxiliary device positioned over and attached to an EV charger in accordance with embodiments of the present disclosure.

FIG. 6 depicts a diagram 600 illustrating an auxiliary device 602 positioned over and attached to an EV charger in accordance with embodiments of the present disclosure. Diagram 600 also illustrates a charging cord holder 604 supporting a charging cord 604 that includes a CCS Type 1 plug 606. The auxiliary device 602 and charging cord holder 604 may have been generated as described in the method of FIG. 4. The auxiliary device 602 may be similar to auxiliary device 118 of FIG. 1 or auxiliary device 318 of FIG. 3.

Figure 7:
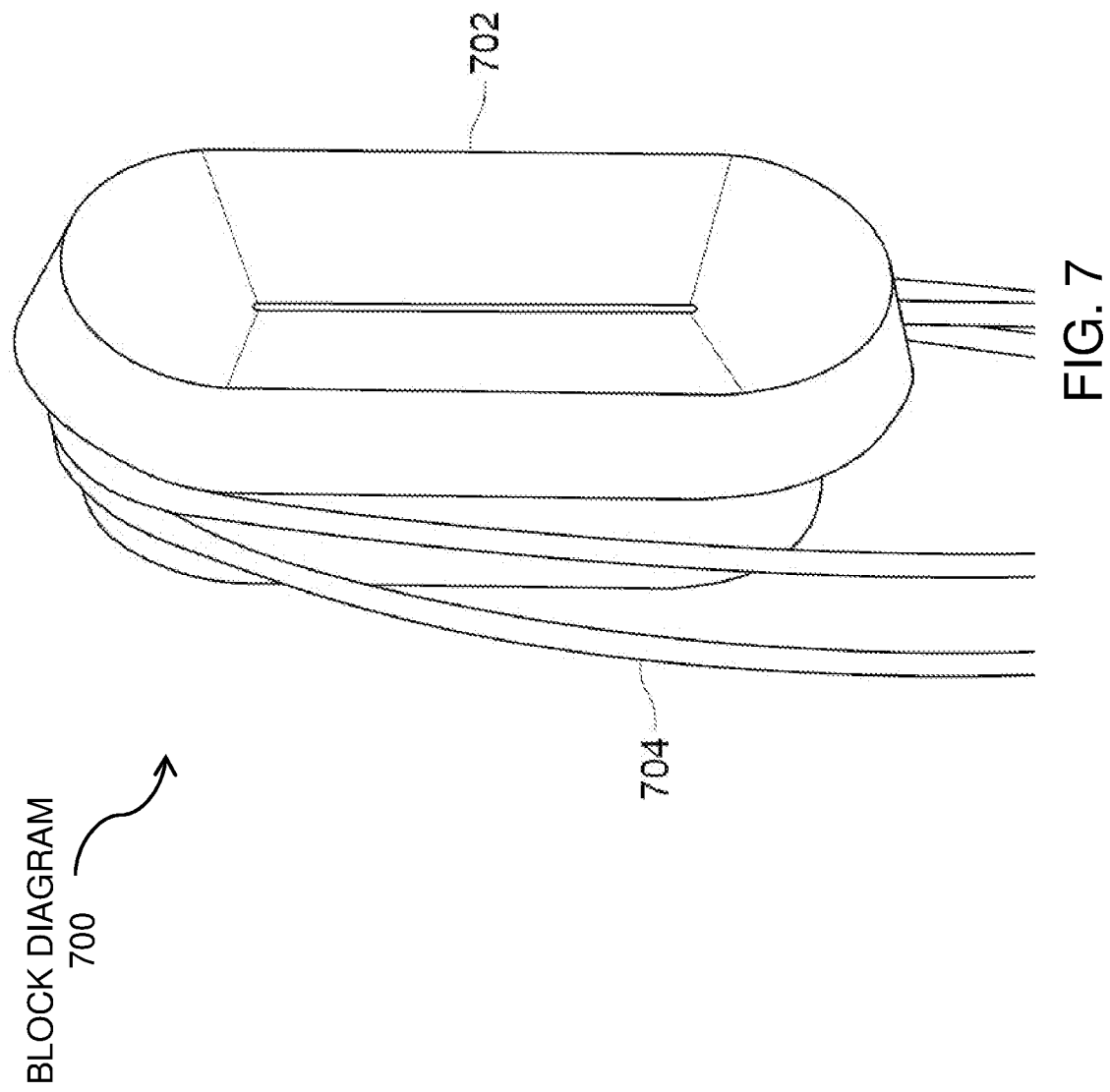
FIG. 7 depicts a diagram illustrating an auxiliary device positioned over and attached to an EV charger in accordance with embodiments of the present disclosure.

FIG. 7 depicts a diagram 700 illustrating an auxiliary device 702 positioned over and attached to an EV charger in accordance with embodiments of the present disclosure. The auxiliary device 702 includes a charging cord holder supporting a charging cord 704. The auxiliary device 702 may have been generated as described in the method of FIG. 4. The auxiliary device 702 may be similar to auxiliary device 118 of FIG. 1 or auxiliary device 318 of FIG. 3.

Figure 8:
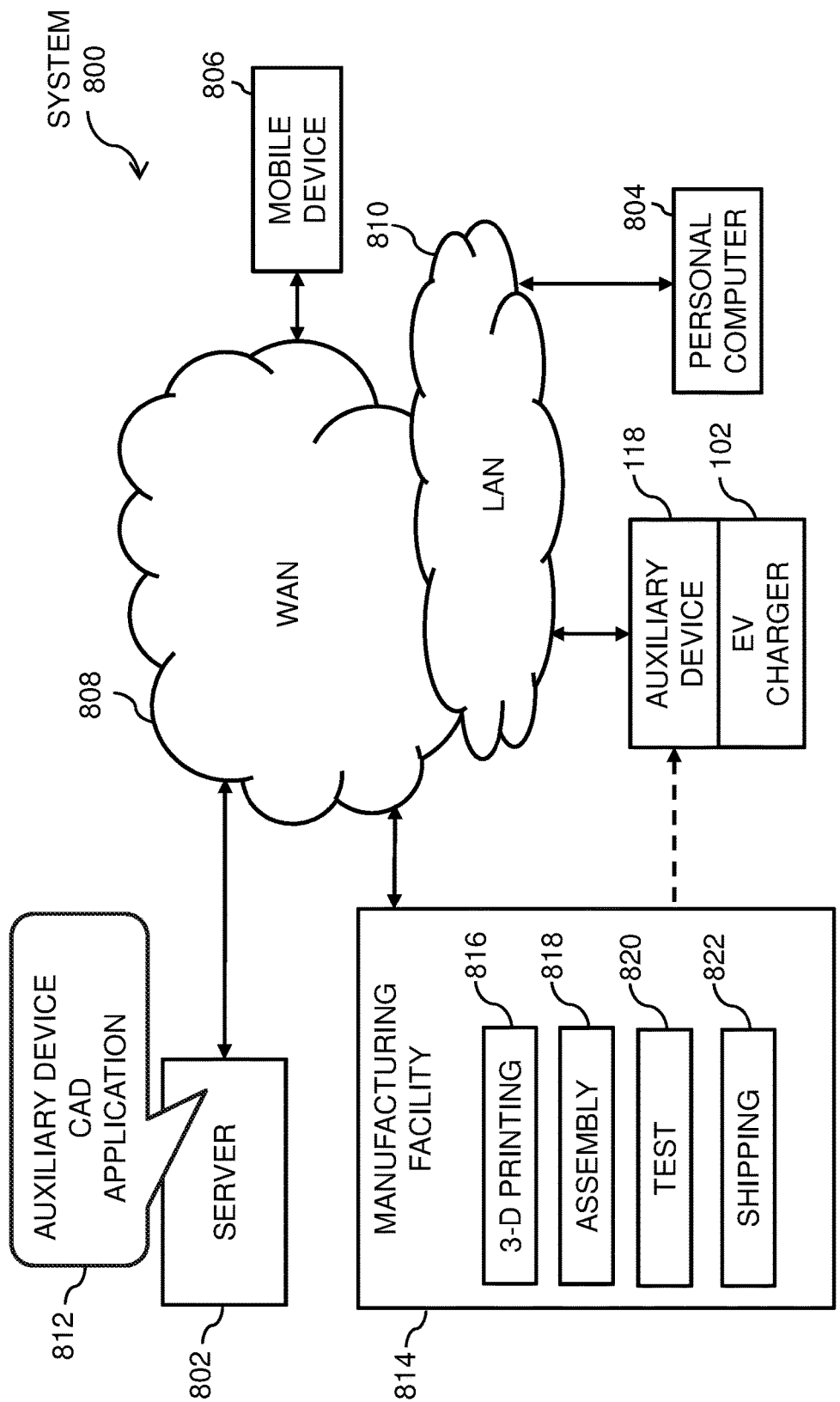
FIG. 8 depicts a diagram illustrating a system (including a server, a personal computer, and a mobile device) for implementing the method of FIG. 4 in accordance with embodiments of the present disclosure.

FIG. 8 depicts a diagram illustrating a system 800 (including a server 802, a personal computer 804, and a mobile device 806) for implementing the method of FIG. 4 in accordance with embodiments of the present disclosure. The personal computer 804 is configured to communicate with the server 802 over a WAN 808 and a LAN 810. The mobile device 806 is configured to communicate with the server over the WAN 808. In other embodiments, the mobile device 806 may be configured to communicate with the server over the WAN 808 and the LAN 810. The system 800 also includes the auxiliary device 118 and the EV charger 102 of FIG. 1. In other embodiments (not shown in FIG. 3), the system 800 may include the auxiliary device 318 and the EV charger 302 of FIG. 3

The server 802 is configured to execute an auxiliary device computer aided design (CAD) application 812. The auxiliary device CAD application 812 is configured for (1) receiving a first plurality of attributes associated with the auxiliary device 118 and/or 318, (2) receiving a second plurality of attributes associated with the EV charger 102 and/or 302, (3) generating a 3-D print file based on the first plurality of attributes and the second plurality of attributes, and (4) transmitting the first 3-D print file to a 3-D printer (i.e., steps 402, 404, 406, and 408 of FIG. 4).

The personal computer 804 and the mobile device 806 are each configured for providing a GUI that allows the user select the first plurality of attributes.

The system 800 also includes a manufacturing facility 814. The manufacturing facility 814 includes 3-D printing 816, assembly 818, test 820, and shipping 822 functions for producing and providing the auxiliary device 118 and/or 318 (i.e., steps 410, 412, 414, and 416 of FIG. 4).

Figure 9:
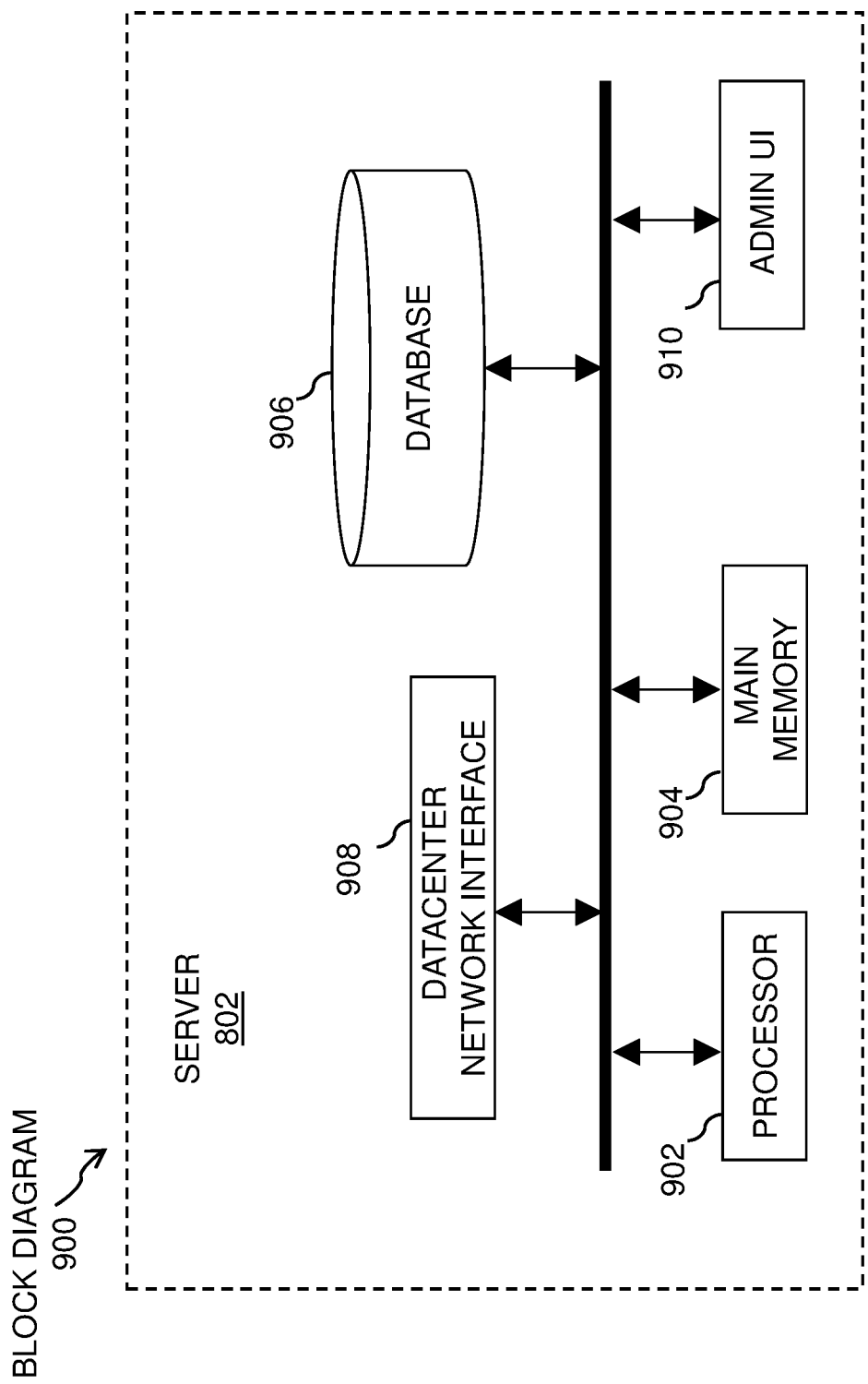
FIG. 9 depicts a block diagram illustrating one embodiment of the server of FIG. 8 in accordance with embodiments of the present disclosure.

FIG. 9 depicts a block diagram 900 illustrating one embodiment of the server 802 of FIG. 8 in accordance with embodiments of the present disclosure. The server 802 includes at least one of processor 902, a main memory 904, a storage memory (e.g., database) 906, a datacenter network interface 908, and an administration user interface (UI) 910. The server 802 may be configured to host an Ubuntu® server. In some embodiments Ubuntu® server may be distributed over a plurality of hardware servers using hypervisor technology.

The processor 902 may be a multi-core server class processor suitable for hardware virtualization. The processor may support at least a 64-bit architecture and a single instruction multiple data (SIMD) instruction set. The main memory 904 may include a combination of volatile memory (e.g., random access memory) and non-volatile memory (e.g., flash memory). The database 906 may include one or more hard drives. The database 906 may be configured to store a plurality of options to be used for configuring the auxiliary device 118 of FIG. 1 and/or the auxiliary device 318 of FIG. 3.

The datacenter network interface 908 may provide one or more high-speed communication ports to the data center switches, routers, and/or network storage appliances. The datacenter network interface 908 may include high-speed optical Ethernet, InfiniB and (IB), Internet Small Computer System Interface (iSCSI), and/or Fibre Channel interfaces. The administration UI may support local and/or remote configuration of the server 802 by a datacenter administrator.

Figure 10:
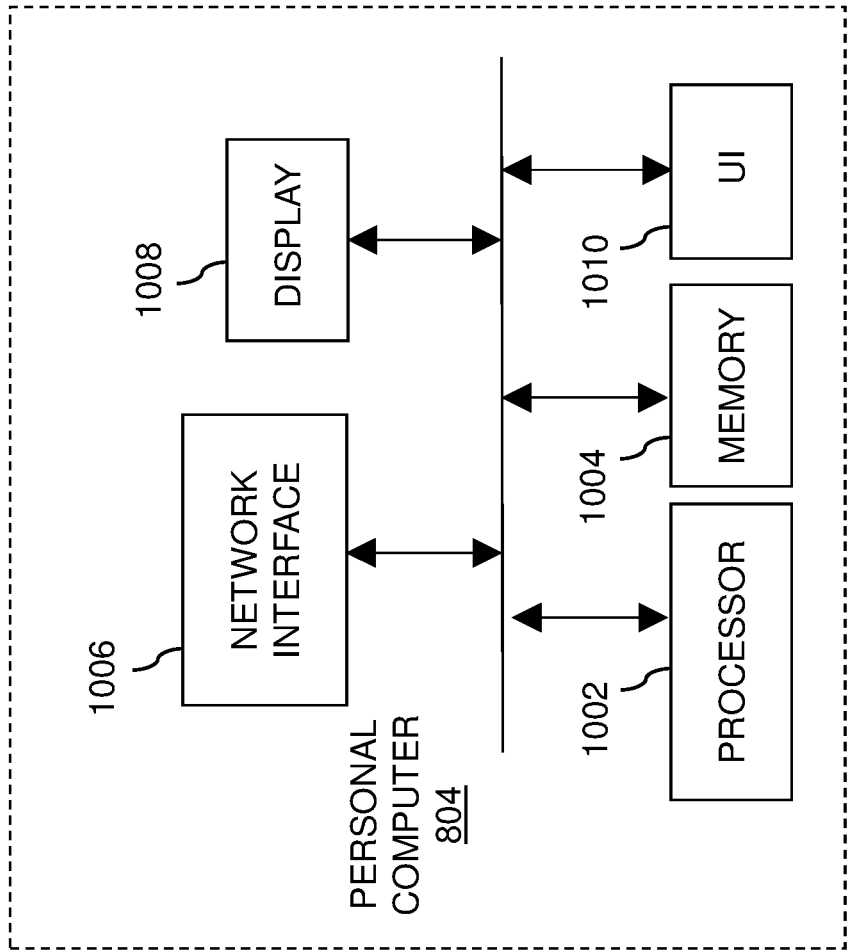
FIG. 10 depicts a block diagram illustrating one embodiment of the personal computer of FIG. 8 in accordance with embodiments of the present disclosure.

FIG. 10 depicts a block diagram illustrating one embodiment of the personal computer 804 of FIG. 8 in accordance with embodiments of the present disclosure. The personal computer 804 includes at least one processor 1002, a memory 1004, a network interface 1006, a display 1008, and a user interface (UI) 1010. The personal computer 804 may include an operating system such as a Windows® OS, a Macintosh® OS, a Linux® OS, or the like. The memory 1004 may include a combination of volatile memory (e.g. random access memory) and non-volatile memory (e.g., solid state drive and/or hard drives). The display 1008 may be an external display (e.g., computer monitor) or internal display (e.g., laptop). The UI 1010 may include a keyboard, and a pointing device (e.g., mouse). The network interface 1006 may be a wired Ethernet interface or a Wi-Fi interface.

Figure 11:
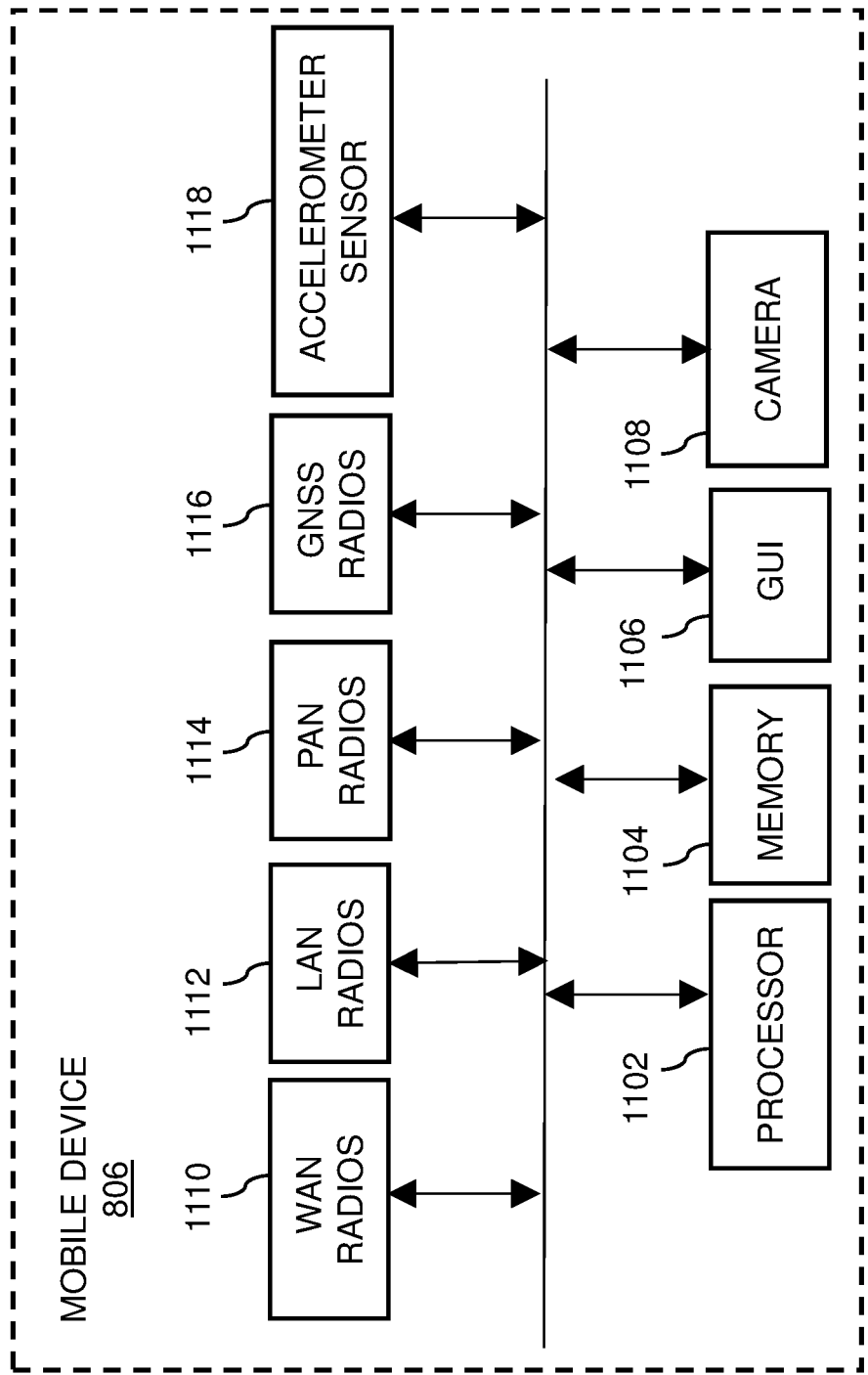
FIG. 11 depicts a block diagram illustrating one embodiment of the mobile device for FIG. 8 in accordance with embodiments of the present disclosure.

FIG. 11 depicts a block diagram illustrating one embodiment of the mobile device 806 for FIG. 8 in accordance with embodiments of the present disclosure. The mobile device 806 may be a smart phone (e.g., cell phone), a tablet, a laptop, a smart watch, or the like. The mobile device 806 includes a processor 1102, a memory 1104, a GUI 1106, a camera 1108, WAN radios 1110, LAN radios 1112, PAN radios 1114, GNSS radios 116, and one or more accelerometer sensors 1118.

In some embodiments the memory 1104 or a portion of the memory 1104 may be integrated with the processor 1102. The memory 1104 may include a combination of volatile memory (e.g., random access memory) and non-volatile memory (e.g., flash memory). In certain embodiments, the processor 1102 may be a mobile processor such as the Qualcomm® Snapdragon® mobile processor. For example, the processor 1102 may be the Snapdragon® 855 mobile processor. The GUI 1106 may be a touchpad display.

The WAN radios 1110 may include 2G, 3G, 4G, and/or 5G technologies. The LAN radios 1112 may include Wi-Fi technologies such as 802.11a, 802.11b/g/n, and/or 802.11ac circuitry. The PAN radios 1114 may include Bluetooth® and/or BLE technologies.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An auxiliary device comprising:
a processor;
a memory electrically coupled with the processor;
a first communication interface electrically coupled with the processor and configured for direct connection to an electric vehicle (EV) charger;
a second communication interface electrically coupled with the processor and configured for connection to an internet protocol (IP) network;
a display electrically coupled with the processor; and
an enclosure that includes a mounting arrangement allowing an end-user of the EV charger to position the auxiliary device over and secure to the EV charger, wherein:
the auxiliary device is custom designed including features for offsetting costs associated with the EV charger by the end-user based on a model number of the EV charger; and
the EV charger was previously installed by a licensed electrician.

2. The auxiliary device of claim 1, wherein a first portion of the enclosure was generated on a three dimensional (3-D) printer using a 3-D print file.

3. The auxiliary device of claim 2, wherein the 3-D print file was generated based on a first plurality of attributes selected by the end-user and a second plurality of attributes associated with the EV charger.

4. The auxiliary device of claim 3, wherein the first plurality of attributes includes at least one of a sports team attribute and an automobile brand attribute.

5. The auxiliary device of claim 3, wherein the first plurality of attributes includes a first attribute associated with the model number.

6. The auxiliary device of claim 3, wherein the second plurality of attributes includes physical dimensions and mounting locations associated with the EV charger.

7. The auxiliary device of claim 3, wherein the first plurality of attributes are selected by a user using a graphical user interface (GUI) on a client device associated with the user.

8. The auxiliary device of claim 3, wherein the end-user purchased the EV charger.

9. The auxiliary device of claim 1 further comprising a third communication interface electrically coupled with the processor and configured for connection to a sub-metering appliance, wherein:
the sub-metering appliance is configured to be wired between the EV charger and a power grid; and
the processor is configured for receiving sub-metering data from the sub-metering appliance via the third communication interface.

10. The auxiliary device of claim 1 wherein:
the EV charger comprises sub-metering circuitry; and
the processor is configured for receiving sub-metering data from the sub-metering circuitry.

11. The auxiliary device of claim 1 wherein the processor is configured for:
receiving media data from the second communication interface; and
presenting the media data via the display.

12. The auxiliary device of claim 1, wherein the first communication interface is at least one of a universal serial bus (USB) interface, an Ethernet interface, and a wireless interface.

13. The auxiliary device of claim 1, wherein the second communication interface is at least one of a wide area network (WAN) interface and a local area network (LAN) interface.

14. The auxiliary device of claim 13, wherein the second communication interface is at least one of a Wi-Fi interface and a cellular interface.

15. A method of manufacture for an auxiliary device, the method including:
   receiving a first plurality of attributes associated with the auxiliary device to be installed on an electric vehicle (EV) charger;
   receiving a second plurality of attributes associated with the EV charger; and
   generating a first three-dimensional (3-D) print file based on the first plurality of attributes and the second plurality of attributes, wherein:
      the 3-D print file is configured for generating an enclosure that includes a mounting arrangement allowing an end-user of the EV charger to position the auxiliary device over and secure to the EV charger;
      the auxiliary device is custom designed including features for offsetting costs associated with the EV charger by the end-user based on a model number of the EV charger; and
      the EV charger was previously installed by a licensed electrician.

16. The method of claim 15, wherein the first plurality of attributes are selected by the end-user using a graphical user interface (GUI) on a client device associated with the end-user.

17. The method of claim 16 further comprising:
   transmitting the first 3-D print file to a 3-D printer; and
   generating the enclosure for the auxiliary device on a 3-D printer using the first 3-D print file.

18. The method of claim 17 further comprising installing a processor, a memory, a display, a first communication interface, and a second communication interface within the enclosure.

19. The method of claim 18, wherein the first communication interface is at least one of a universal serial bus (USB) interface, an Ethernet interface, and a wireless interface.

20. The method of claim 18, wherein the second communication interface is at least one of a wide area network (WAN) interface and a local area network (LAN) interface.

21. The method of claim 18 further comprising installing a third communication interface.

22. The method of claim 21, wherein the third communication interface is an RS-485 compliant interface.

23. The method of claim 18 further comprising:
   packaging the auxiliary device for shipment; and
   shipping the auxiliary device to an address associated with the end-user.

24. The method of claim 23 further comprising:
   generating a second 3-D print file based on the first plurality of attributes and the second plurality of attributes;
   transmitting the second 3-D print file to the 3-D printer or another 3-D printer;
   generating a charging cord holder using the second 3-D print file;
   packaging the charging cord holder for shipment; and
   shipping the charging cord holder to the address associated with the end-user.

25. The method of claim 15, wherein the first plurality of attributes includes at least one of a sports team attribute and an automobile brand attribute.

26. The method of claim 15, wherein the first plurality of attributes includes a first attribute associated with the model number.

27. The method of claim 15 further comprising:
   minting a non-fungible token (NFT) of a likeness of the auxiliary device; and
   providing the NFT to a crypto wallet associated with the end-user.

* * * * *

UNITED STATES PATENT AND TRADEMARK OFFICE
CERTIFICATE OF CORRECTION

| | | |
|---|---|---|
| PATENT NO. | : 11,927,939 B2 | Page 1 of 1 |
| APPLICATION NO. | : 18/307967 | |
| DATED | : March 12, 2024 | |
| INVENTOR(S) | : Kimberly Sarubbi et al. | |

It is certified that error appears in the above-identified patent and that said Letters Patent is hereby corrected as shown below:

On the Title Page

Item (12), "Sarubbi" should read:
--Sarubbi et al.--

Item (72), should read:
(72) Inventors: Kimberly Sarubbi, Brentwood, TN (US);
Oleg Logvinov, Weston, CT (US);
Michael J. Macaluso, Jackson, NJ (US)

Signed and Sealed this
Seventeenth Day of December, 2024

Derrick Brent
*Acting Director of the United States Patent and Trademark Office*